(12) United States Patent
Wang et al.

(10) Patent No.: US 12,482,697 B2
(45) Date of Patent: Nov. 25, 2025

(54) SUBSTRATE SUPPORTING APPARATUS

(71) Applicant: ACM RESEARCH (SHANGHAI), INC., Shanghai (CN)

(72) Inventors: Hui Wang, Shanghai (CN); Feng Liu, Shanghai (CN); Xiaofeng Tao, Shanghai (CN); Shena Jia, Shanghai (CN); Fuping Chen, Shanghai (CN); Haibo Hu, Shanghai (CN); Yang Liu, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 403 days.

(21) Appl. No.: 18/257,973

(22) PCT Filed: Dec. 16, 2020

(86) PCT No.: PCT/CN2020/136658
§ 371 (c)(1),
(2) Date: Jun. 16, 2023

(87) PCT Pub. No.: WO2022/126403
PCT Pub. Date: Jun. 23, 2022

(65) Prior Publication Data
US 2024/0105496 A1 Mar. 28, 2024

(51) Int. Cl.
*H01L 21/687* (2006.01)
*H01L 21/67* (2006.01)
(52) U.S. Cl.
CPC .... *H01L 21/68764* (2013.01); *H01L 21/6708* (2013.01); *H01L 21/6715* (2013.01); *H01L 21/68735* (2013.01); *H01L 21/68742* (2013.01)

(58) Field of Classification Search
CPC .......... H01L 21/68764; H01L 21/6708; H01L 21/6715; H01L 21/68735; H01L 21/68742;
(Continued)

(56) References Cited

U.S. PATENT DOCUMENTS 5,904,164 A 5/1999 Wagner et al.
6,328,846 B1 12/2001 Langen et al.
2015/0325466 A1 11/2015 Wang et al.

FOREIGN PATENT DOCUMENTS

CN 1351368 A 5/2002

OTHER PUBLICATIONS

Search Report issued for corresponding international patent application No. PCT/CN2020/136658, mailed Sep. 15, 2021 (3 pages).
(Continued)

*Primary Examiner* — Rodney G Mcdonald
(74) *Attorney, Agent, or Firm* — Osha Bergman Watanabe & Burton LLP

(57) ABSTRACT

The present invention provides a substrate supporting apparatus having a spin chuck and a plurality of locating pins. The spin chuck configured to support and rotate a substrate has a supporting surface. The locating pins are disposed at the periphery of the supporting surface for limiting the substrate horizontal displacement. The supporting surface defines a first annular region. The first annular region is divided into a plurality of pin regions and a plurality of non-pin regions. The pin regions and the non-pin regions are arranged alternatively in a circumferential direction of the first annular region. Each of the pin regions is corresponding to one locating pin. A plurality of Bernoulli holes are set in the first annular region and is configured as an uneven structure in the first annular region so as to supply stronger gas flow in the pin regions than in the non-pin regions.

10 Claims, 10 Drawing Sheets

(58) Field of Classification Search
CPC ........... H01L 21/68728; H01L 21/6875; H01L 21/6838; H01L 21/68; H01J 37/32715
USPC ................................................ 118/728, 730
See application file for complete search history.

(56) References Cited

OTHER PUBLICATIONS

Written Opinion issued for corresponding international patent application No. PCT/CN2020/136658, mailed Sep. 15, 2021 (3 pages).

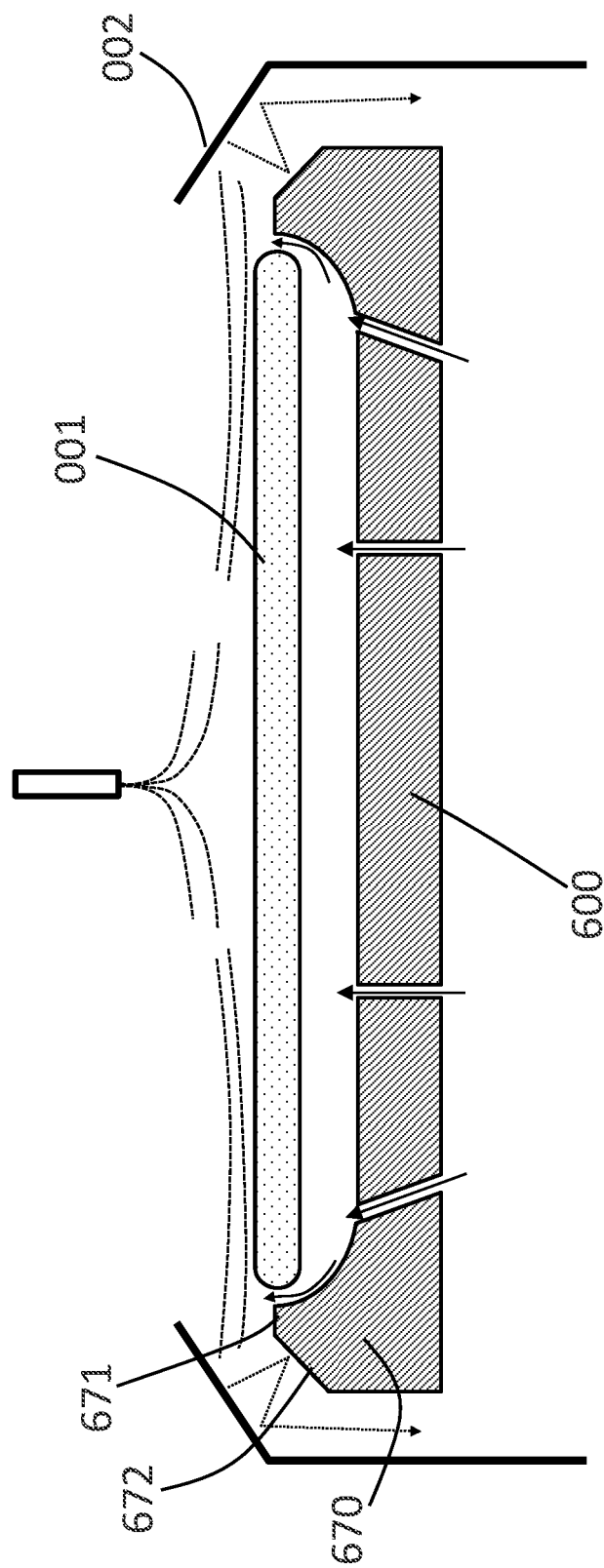

SUBSTRATE SUPPORTING APPARATUS

BACKGROUND OF THE INVENTION

1. Field of the Invention

The present invention generally relates to a substrate supporting apparatus, and more particularly to a substrate supporting apparatus for supporting a substrate by Bernoulli principle, which is able to prevent the lower surface and edge of the substrate from being treated.

2. The Related Art

A Bernoulli chuck is usually used to suck and support a substrate in the way there's no contact with the substrate especially in the process of substrate backside treatment, which can reduce the chuck polluting the substrate. In the process, some treating liquid is sprayed to the substrate back surface for treating the substrate surface. The treating liquid is not allowed to treat the front surface and edge of the substrate. However, the treating liquid easily flows toward the substrate front surface along locating pins which are used to limit the substrate horizontal displacement during the process, leading to so-called pin marks on the front surface of the substrate near the locating pins.

This problem is mentioned and solved in the U.S. Pat. No. 6,328,846B1 which discloses that each locating pin has associated with a separate nozzle, through which a gas is jetted to the region of the associated locating pin from below. The nozzles are outside and at a distance from the Bernoulli nozzles supplying gas to form a gas cushion for floating the substrate. In this way, the treating fluid is blown away before it may reach the regions adjacent to the locating pins. But the nozzle associated with each locating pin and the Bernoulli nozzles are under independent control, which would increase the complexity of the Bernoulli chuck structure and operation.

SUMMARY

The present invention provides a substrate supporting apparatus to solve the pin marks problem mentioned in the prior art. According to an embodiment of the present invention, a substrate supporting apparatus includes a spin chuck for supporting and rotating a substrate, a plurality of locating pins for limiting the substrate horizontal displacement, and a plurality of Bernoulli holes for supplying gas to the substrate from below and forming a cushion to float the substrate and suck the substrate by Bernoulli effect. The spin chuck has a supporting surface defining a first annular region on it. The first annular region is divided into a plurality of pin regions and a plurality of non-pin regions. The pin regions and the non-pin regions are arranged alternatively in a circumferential direction of the first annular region. Each of the pin regions is corresponding to one locating pin. The Bernoulli holes are configured as an uneven structure in the first annular region so as to supply stronger gas flow in the pin regions than in the non-pin regions. Specifically, the diameter or the density of the Bernoulli holes is larger near the locating pins than the other regions, thereby gas flow dispensed near the locating pins is beyond that in the other regions, leading to the gas flow stronger near the locating pins and prevent the treating liquid from flowing along with the locating pins to the edge and the lower surface of the substrate. In order to avoid the lower surface of the substrate being treated further, a convex-ring is configured on the periphery of the spin chuck to form a recess above the supporting surface. The convex-ring not only changes the flow route of the treating liquid to let the treating liquid not rebound to any surface of the substrate but also can form a gap between the inner wall of the convex-ring and the edge of the substrate held in the recess to form strong protective gas, which are all benefit to reduce the risk that the treating liquid flows to the lower surface of the substrate and the undesirable contamination on the substrate.

BRIEF DESCRIPTION OF THE DRAWINGS

The present invention will be apparent to those skilled in the art by reading the following description of preferred embodiments thereof, with reference to the attached drawings, in which:

FIG. 10 is a cross-sectional view showing yet another substrate supporting apparatus according to an exemplary embodiment of the present invention.

DETAILED DESCRIPTION OF EMBODIMENTS

Figure 1:
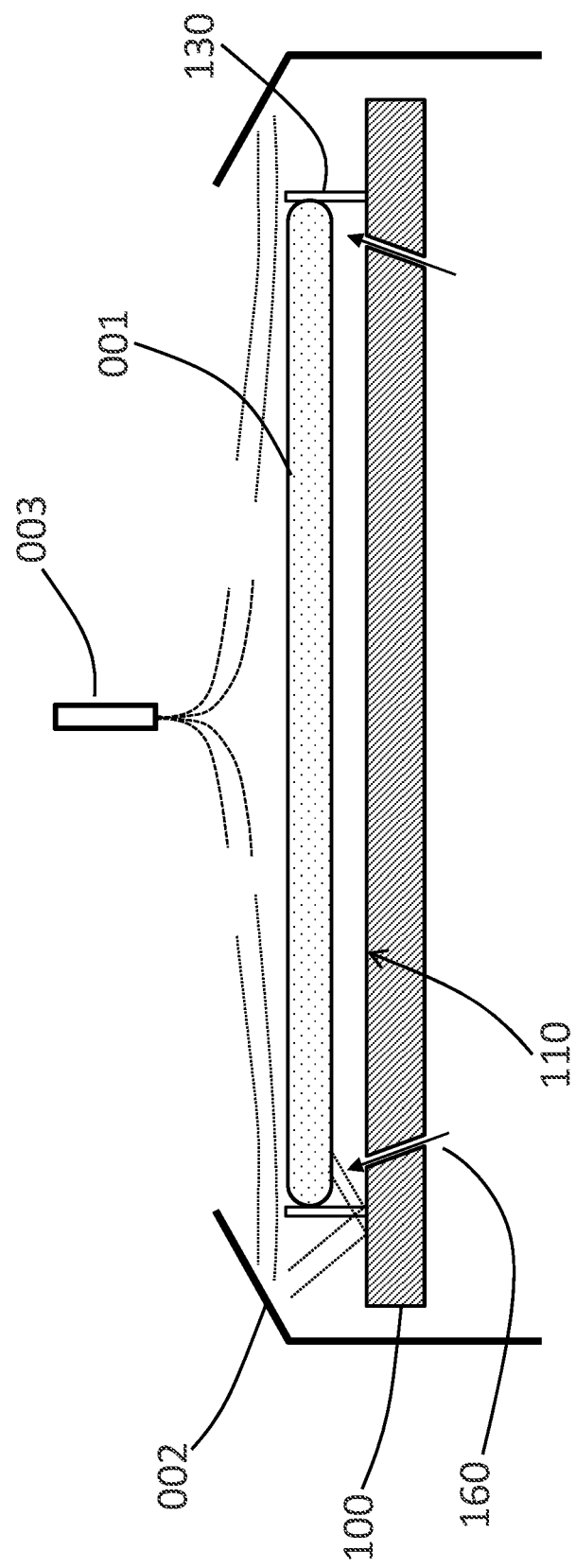
FIG. 1 is a cross-sectional view showing a substrate supporting apparatus according to an exemplary embodiment of the present invention.

Referring to FIG. 1, a substrate supporting apparatus according to one exemplary embodiment of the present invention is shown. The substrate supporting apparatus comprises a spin chuck 100 configured to support and rotate a substrate. The spin chuck 100 has a supporting surface 110 for supporting a substrate 001. A plurality of locating pins 130 arranged at the periphery of the supporting surface 110 are engaged with the edge of the substrate 001 for limiting the substrate 001 horizontal displacement. The supporting surface 110 is the top surface of the spin chuck 100 and is surrounded by the plurality of locating pins 130. At least one nozzle 003 is employed to dispense various treating liquids such as SC-1, SC-2, SPM, HF, DIW, etc. to the surface of the substrate 001 which is positioned above the supporting surface 110 of the spin chuck 100.

Figure 2:
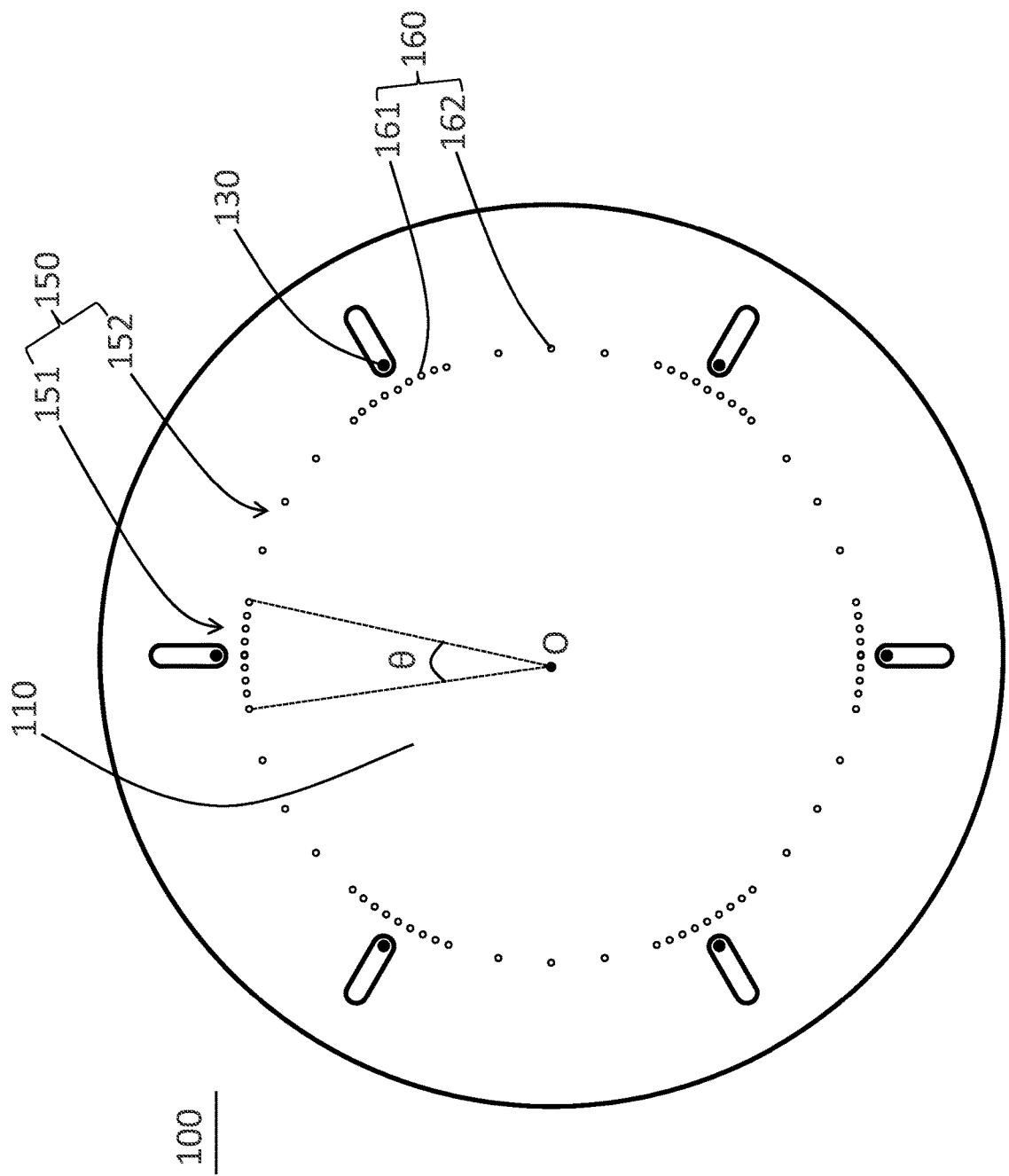
FIG. 2 is a top view showing one exemplary spin chuck.

As shown in FIG. 1 and FIG. 2, a first annular region 150 is defined on the supporting surface 110 of the spin chuck 100. A plurality of Bernoulli holes 160 are set in the first annular region 150. Each of the Bernoulli holes 160 is inclined relative to the central axis of the spin chuck 100, and is suitable for supplying gas to the lower surface of the substrate 001 to form a cushion and generate Bernoulli effect so that the substrate 001 can be sucked and float above the supporting surface 110 of the spin chuck 100 without contacting the supporting surface 110. The plurality of Bernoulli holes 160 composing a circle are simultaneously supplied with inert gas or nitrogen by one gas supply pipeline.

Generally, the spin chuck 100 is mounted on a rotary spindle connecting with a driving mechanism that can drive the spin chuck 100 and the rotary spindle to synchronously rotate, and at least one gas supply pipeline is configured to supply gas to the holes defined on the spin chuck 100, such as Bernoulli holes 160. The above features are understood by those skilled in the art, so it is not repeated in the present invention and not illustrated in the following drawings.

Referring to FIG. 2, the first annular region 150 is divided into a plurality of pin regions 151 and a plurality of non-pin regions 152 according to distance from the locating pins 130. Each of the pin regions 151 is corresponding to one locating pin 130. The Bernoulli holes 160 are divided into a plurality of first groups of Bernoulli holes 161 and a plurality of second groups of Bernoulli holes 162. Every first group of Bernoulli holes 161 is corresponding to one pin region 151 and every second group of Bernoulli holes 162 is corresponding to one non-pin region 152. The first group of Bernoulli holes 161 is closer to the locating pin 130 than the second group of Bernoulli holes 162. The pin regions 151 and the non-pin regions 152 are arranged alternatively and symmetrically in a circumferential direction of the first annular region 150. A central angle θ of each of the pin regions 151 is 5°~10°. It is noteworthy that each locating pin 130 is positioned on the line connecting the center of the corresponding pin region 151 and the center of the first annular region 150. In the present invention, the plurality of Bernoulli holes 160 are configured as an uneven structure in the first annular region 150, so that the gas flow supplied from the first groups of Bernoulli holes 161 in the pin regions 151 is stronger than the second groups of Bernoulli holes 162 in the non-pin regions 152.

In the present invention, the uneven structure of the Bernoulli holes 160 in the first annular region 150 mainly embodies the variation of the diameter or the density of the Bernoulli holes 160 in the different regions (e.g. pin regions 151 or non-pin regions 152) in the circumference direction of the first annular region 150. When the total gas amount supplied to the Bernoulli holes 160 which are configured as an uneven structure in the present invention is equal to that supplied to Bernoulli holes which are configured as an even structure in a traditional spin chuck, it makes the gas flow stronger near the locating pins 130 by changing the diameter or the density of the Bernoulli holes 160 adjacent to the locating pins 130 in the present invention. Namely, without changing the gas supply amount, stronger local gas force is imposed on the regions near the locating pins 130 through more gas flow being dispensed to the vicinity of the locating pins 130, which is able to prevent the treating liquid from etching the edge and the lower surface of the substrate 001 in the complete circumference, especially adjacent to the locating pins 130. Several examples for spin chuck with uneven structure of the Bernoulli holes will be introduced in detail in the following.

Referring to FIG. 2, it shows one exemplary spin chuck 100 for supporting a substrate and having unevenly Bernoulli holes 160 set in a first annular region 150 of the spin chuck 100, wherein the density of the first groups of Bernoulli holes 161 in the pin regions 151 is higher than the density of the second groups of Bernoulli holes 162 in the non-pin regions 152. As shown in FIG. 2, the density of the first groups of Bernoulli holes 161 in the pin regions 151 is the same, and the density of the second groups of Bernoulli holes 162 in the non-pin regions 152 is also the same but less than that of the first groups of Bernoulli holes 161 in the pin regions 151. Preferably, the density of each of the first groups of Bernoulli holes 161 also can be designed to gradually become larger with the distance between the Bernoulli holes 161 and the corresponding locating pin 130 decreasing, and the density of the second groups of Bernoulli holes 162 in the non-pin regions 152 has a set value no more than the minimal density of the first groups of Bernoulli holes 161 in the pin regions 151.

Figure 3:
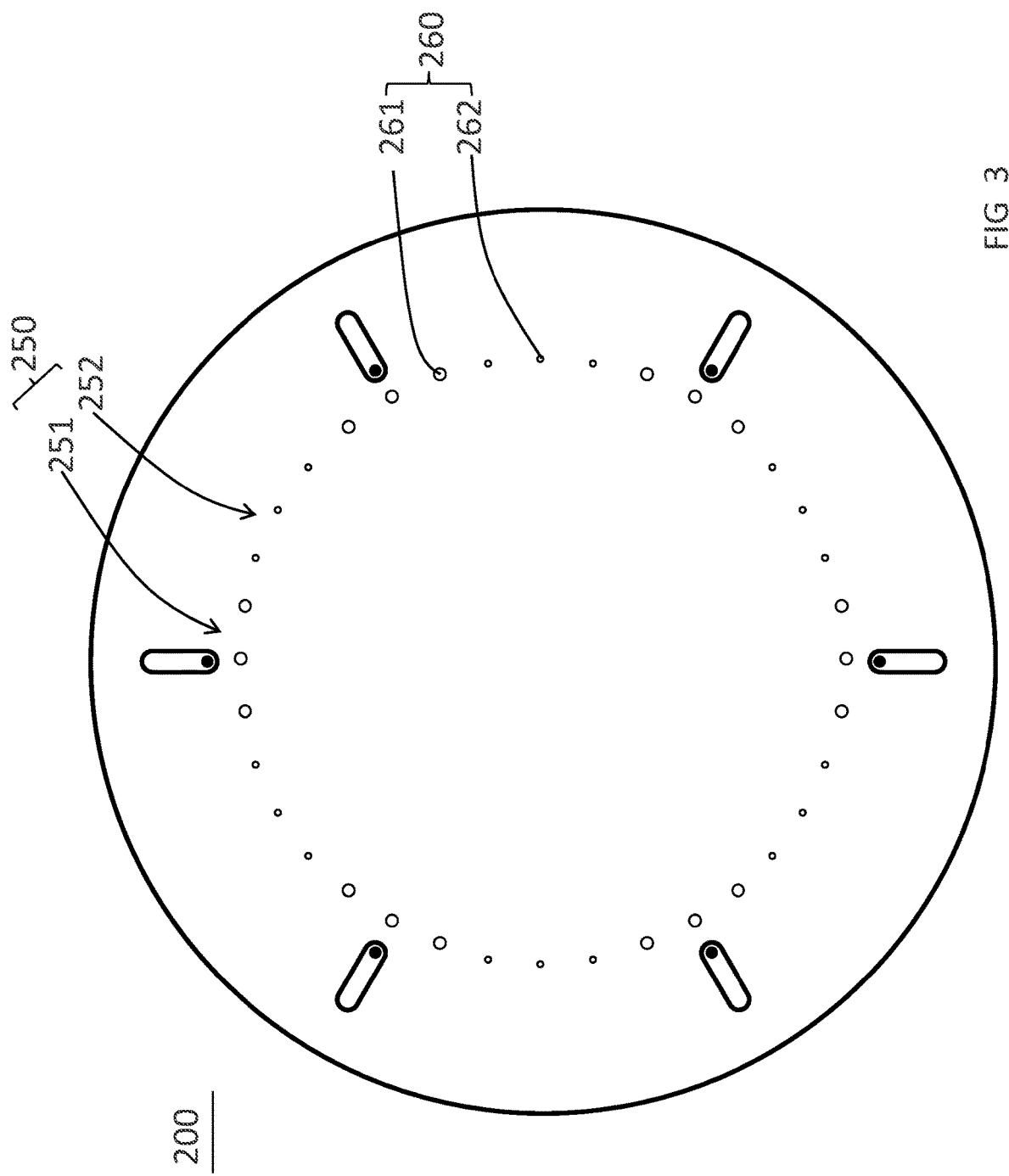
FIG. 3 is a top view showing another exemplary spin chuck.

Referring to FIG. 3, it shows another exemplary spin chuck 200 for supporting a substrate and having unevenly Bernoulli holes 260 set in a first annular region 250 of the spin chuck 200, wherein the diameter of the first groups of Bernoulli holes 261 in the pin regions 251 is higher than the diameter of the second groups of Bernoulli holes 262 in the non-pin regions 252. As shown in FIG. 3, the diameter of the first groups of Bernoulli holes 261 in the pin regions 251 is the same, and the diameter of the second groups of Bernoulli holes 262 in the non-pin regions 252 is also the same but less than that of the first groups of Bernoulli holes 261 in the pin regions 251. Preferably, the diameter of each of the first groups of Bernoulli holes 261 in the pin regions 251 also can be designed to gradually become larger with the distance between the Bernoulli holes 261 and the corresponding locating pin decreasing, and the diameter of the second groups of Bernoulli holes 262 in the non-pin regions 252 has a set value no more than the minimal diameter of the first groups of Bernoulli holes 261 in the pin regions 251.

Figure 4:
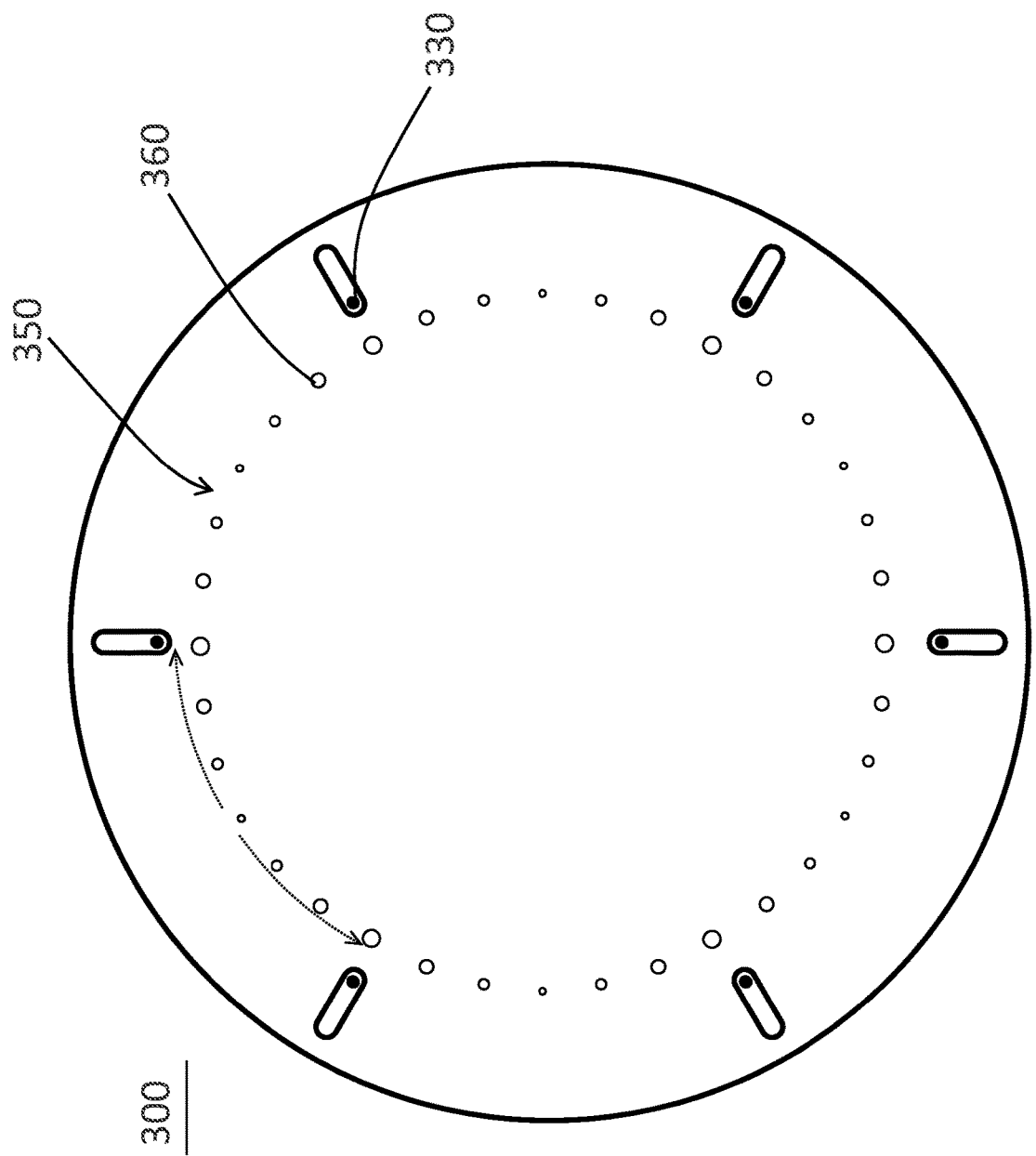
FIG. 4 is a top view showing another exemplary spin chuck.

Referring to FIG. 4, it shows another exemplary spin chuck 300 for supporting a substrate and having unevenly Bernoulli holes 360 set in a first annular region 350 of the spin chuck 300, wherein the diameter of the Bernoulli holes 360 in the first annular region 350 gradually becomes larger with the distance between the Bernoulli holes 360 and the locating pins 330 decreasing, as indicated by the arrows in FIG. 4.

Figure 5:
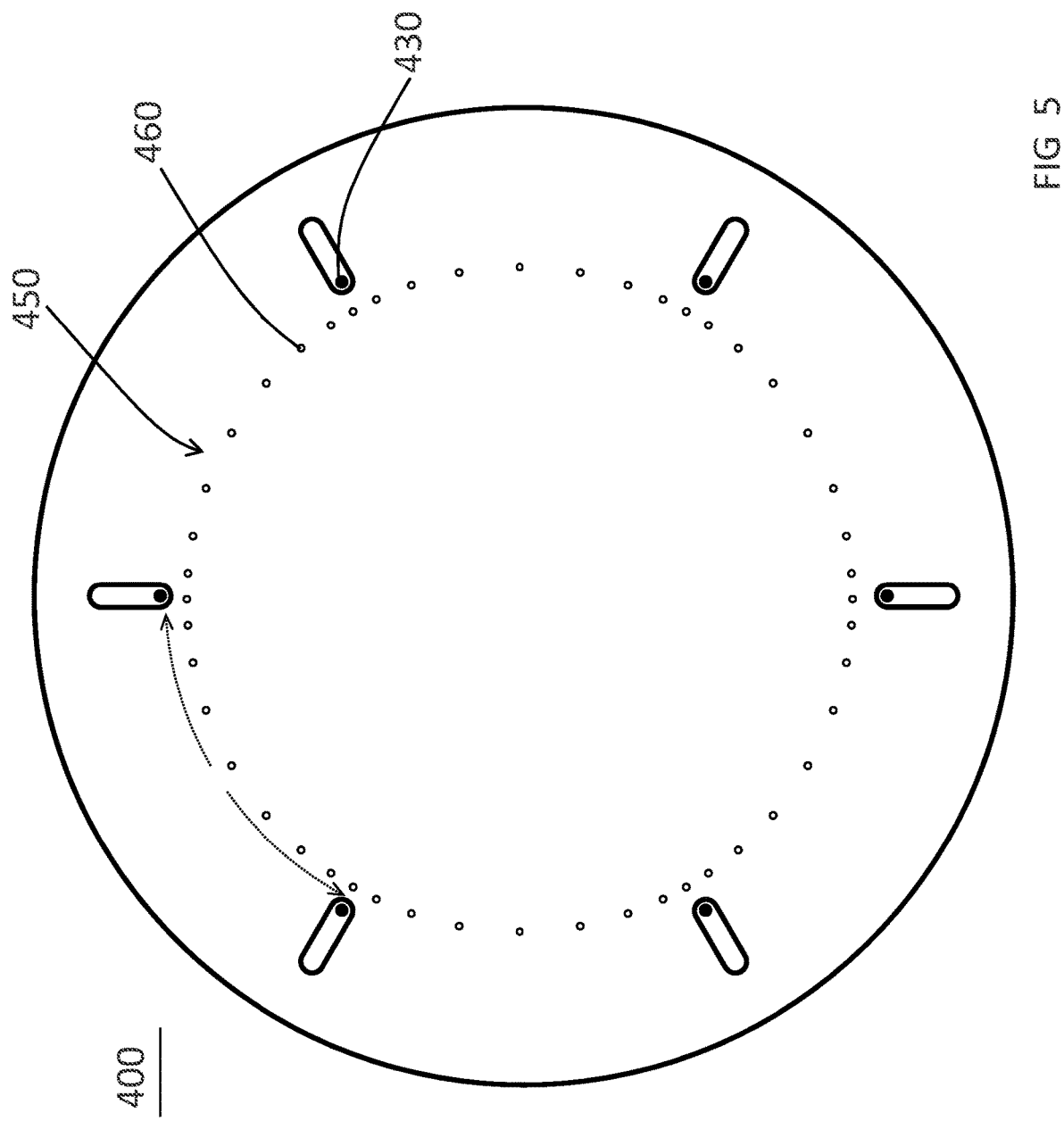
FIG. 5 is a top view showing another exemplary spin chuck.

Referring to FIG. 5, it shows another exemplary spin chuck 400 for supporting a substrate and having unevenly Bernoulli holes 460 set in a first annular region 450 of the spin chuck 400, wherein the density of the Bernoulli holes 460 in the first annular region 450 gradually becomes larger with the distance between the Bernoulli holes 460 and the locating pins 430 decreasing, as indicated by the arrows in FIG. 5.

As described above, no matter the diameter or the density of Bernoulli holes is larger in the pin regions than in the non-pin regions or the diameter or the density of Bernoulli holes gradually becomes larger as the Bernoulli holes approach to the corresponding locating pins, for each, the goal is to increase the gas flow dispensed to the regions near the locating pins and make it exceed the gas flow dispensed to the other regions so that the stronger gas flow and gas force are imposed in the regions near the locating pins to avoid the treating liquid traveling from the upper surface of the substrate to the edge of the substrate, even to the lower surface of the substrate, leading to undesirable pin marks.

Figure 6:
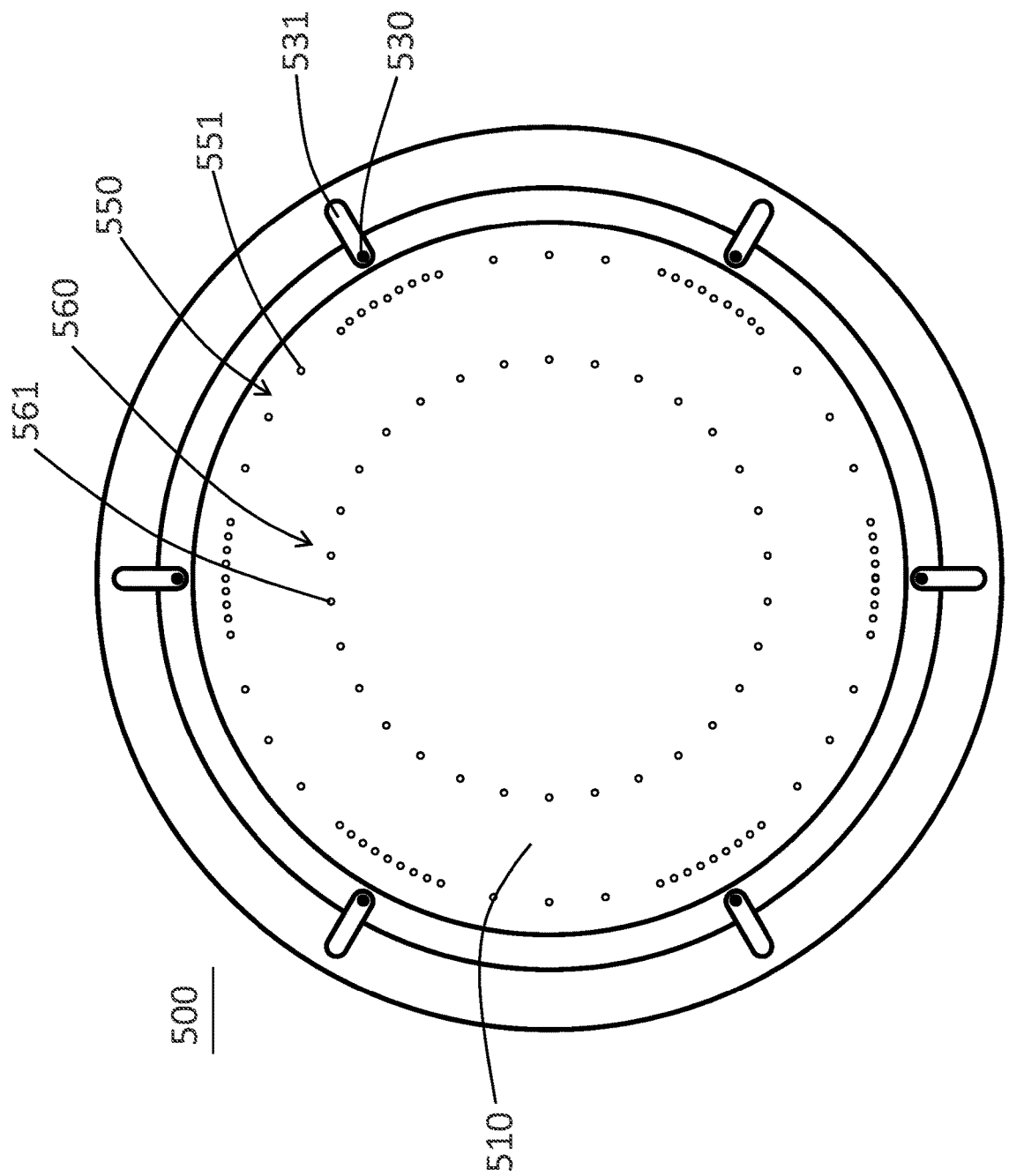
FIG. 6 is a top view showing one exemplary spin chuck of another substrate supporting apparatus according to an exemplary embodiment of the present invention.
Figure 7:
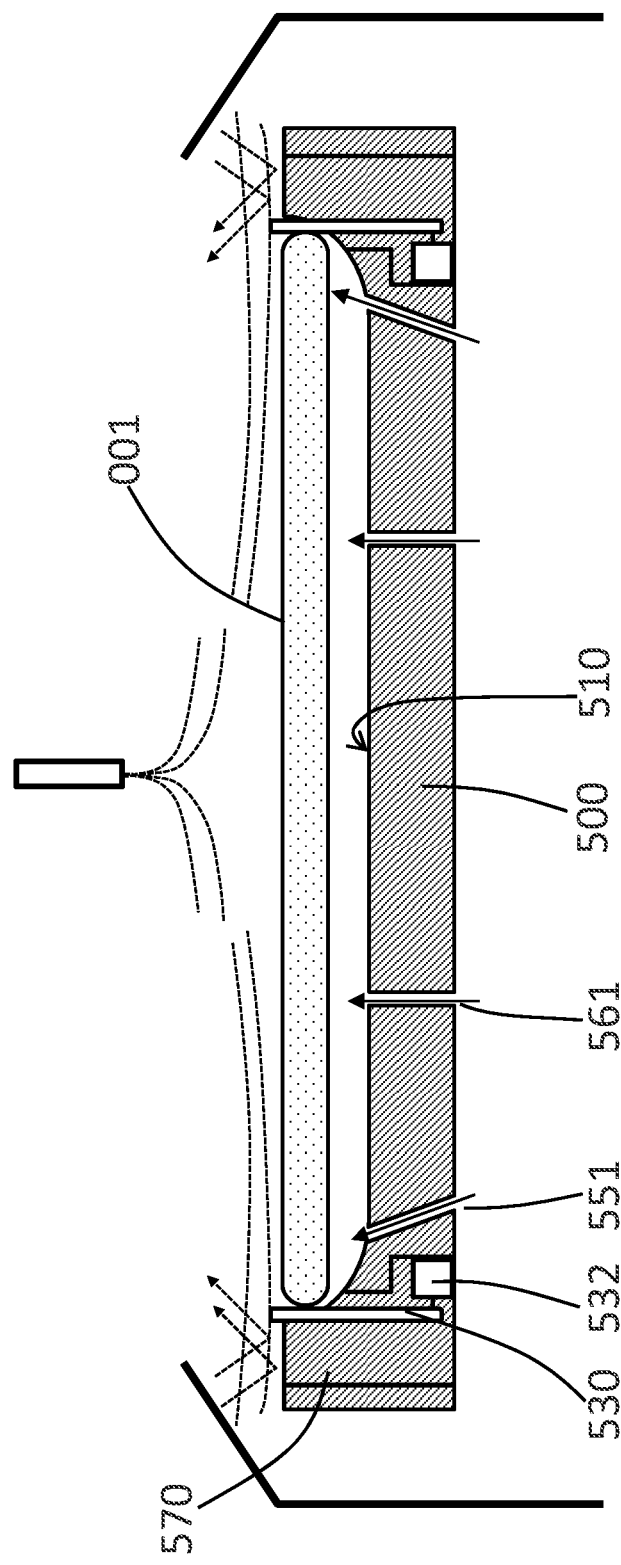
FIG. 7 is a cross-sectional view showing another substrate supporting apparatus.

Another exemplary substrate supporting apparatus is also provided in the present invention. As shown in FIG. 6 and FIG. 7, the substrate supporting apparatus includes a spin chuck 500 with a supporting surface 510 for supporting a substrate 001 and a plurality of Bernoulli holes 551 set in a first annular region 550 defined on the supporting surface 510. Because the Bernoulli holes 551 configured as an uneven structure is the same as the previous description (such as the Bernoulli holes configured as an uneven structure in the spin chuck (100, 200, 300, 400 e.g.)), it is not repeated here. Similarly, a plurality of locating pins 530 are arranged surrounding the periphery of the supporting surface 510 to position the substrate 001 by moving radially inwardly or release the substrate 001 by moving radially outwardly. Each of the locating pins 530 is disposed in a corresponding locating slot 531 on the spin chuck 500, and configured to connect a driving device 532 such as a motor or a cylinder for driving the locating pin 530 to move along the radial direction of the support surface 510.

Referring to FIG. 6 and FIG. 7 again, the substrate supporting apparatus of this embodiment further includes a convex-ring 570 protruding upward on the periphery of the supporting surface 510 and a plurality of lift holes 561 set in a second annular region 560 defined on the supporting surface 510. The plurality of lift holes 561 are distributed evenly in the second annular region 560. The second annular region 560 is concentric with the first annular region 550 and is located inside the first annular region 550. The lift holes 561 are used to supply gas to lift the substrate 001 and adjust the height between the substrate 001 and the supporting surface 510.

The convex-ring 570 is capable of being detachably mounted on the supporting surface 510 of the spin chuck 500 so that the substrate supporting apparatus can be suitable for various substrates with different sizes such as 200 mm or 300 mm by replacing the appropriate size of convex-ring. Of course, the convex-ring 570 and the spin chuck 500 can also be molded in an integrated body as FIG. 7 shown.

Figure 8:
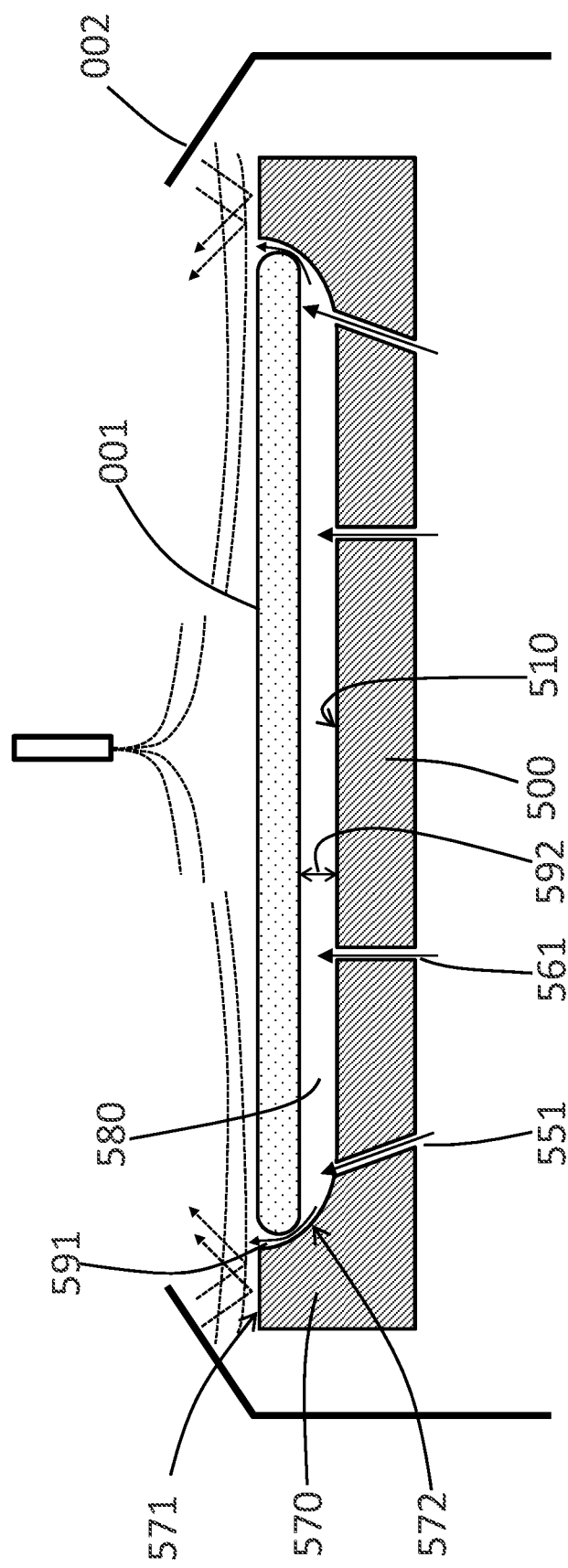
FIG. 8 is another cross-sectional view showing another substrate supporting apparatus.

As shown in FIG. 8, the top surface 571 of the convex-ring 570 is higher than the supporting surface 510, leading to a recess 580 formed. The supporting surface 510 is served as the bottom surface of the recess 580. When the substrate 001 is held in the recess 580 of the spin chuck 500, there are two gaps formed between the substrate 001 and the spin chuck 500, and thereinto, a first gap 591 is formed between the inner wall 572 of the convex-ring 570 and the edge of the substrate 001, and a second gap 592 is formed between the supporting surface 510 and the lower surface of the substrate 001.

Usually, a shield 002 is configured to surround the spin chuck 500 to prevent the treating liquid from splashing to the environment. If there is no convex-ring configured on the periphery of the supporting surface 110, as shown in FIG. 1, a part of treating liquid sputtered on the shield 002 may be directly splashed back on the supporting surface 110, and then rebounded again to the lower surface of the substrate 001 through the gap between the substrate 001 and the supporting surface 110, which makes the lower surface of the substrate 001 be polluted. Therefore, one of the functions of the convex-ring 570 is to change the flow route of the treating liquid sputtered on the shield 002 to avoid the treating liquid rebounding to the lower surface of the substrate 001. Referring to FIG. 8, the treating liquid is firstly splashed back on the top surface 571 of the convex-ring 570 after it is sputtered to the shield 002 and then rebounded upwardly without contacting any surface of the substrate 001, so that it can avoid the treating liquid polluting the undesired treated surface of the substrate 001.

Referring to FIG. 10, it shows another exemplary convex-ring 670 on the spin chuck 600. The outer edge of the top surface 671 of the convex-ring 670 is chamfered, in other words, the outer edge of the top surface 671 of the convex-ring 670 has a radially outward bevel 672. After the treating liquid from the shield 002 is splashed to the bevel 672, it can be rebounded again to the shield 002 and then drained away.

Figure 9:
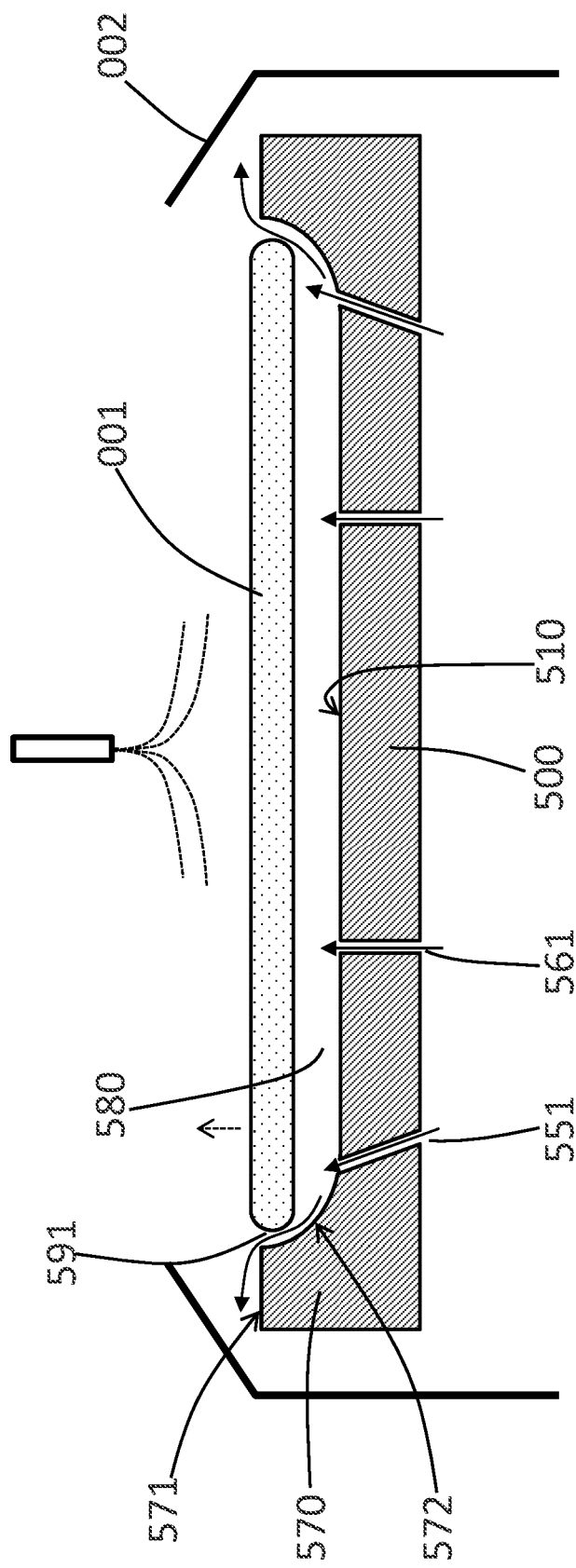
FIG. 9 is a cross-sectional view showing a substrate moves up slightly.

Please refer to FIG. 7 to FIG. 9. The inner diameter of the convex-ring 570 becomes larger from the lower to the upper of the recess 580 so that the first gap 591 can be changed by adjusting the height between the substrate 001 and the supporting surface 510. In particular, the inner wall 572 of the convex-ring 570 is an arc in shape such as a circular arc or an ellipse arc, which is also beneficial for guiding the gas sprayed by the Bernoulli holes 551 and the lift holes 561 out of the first gap 591.

As shown in FIG. 9, when the substrate 001 rises up, the gap 591 between the edge of the substrate 001 and the inner wall 572 of the convex-ring 570 is widened, which leads to the gas flow released from the annular first gap 591 be increased to form better gas protection in the complete circumference of the substrate 001.

A method for holding a substrate by the substrate supporting apparatus in an embodiment is introduced as following.

In step 1, a robot takes one substrate to be above the spin chuck, and makes the center of the substrate be aligned with the center of the supporting surface.

In step 2, gas with a first pressure is supplied to the lift holes for lifting the substrate up at a first position above the supporting surface, and the robot moves away. When the substrate is located at the first position, the height between the lower surface of the substrate and the supporting surface is not beyond the height of the recess. The height of the first position can be adjusted by changing the first pressure.

In step 3, gas with a second pressure is supplied to the Bernoulli holes before the gas supplied to the lift holes is cut off, forming a cushion below the substrate for making the substrate float on it. The second pressure is lower than the first pressure so that the substrate moves a little downwardly after gas switching.

In step 4, when the substrate is position steadily at the predetermined height, the locating pins are driven radially inwardly to engage with the edge of the substrate for limiting the substrate horizontal displacement.

After the above steps, at least one nozzle is moved above the substrate and sprays treating liquid to the surface of the substrate, meanwhile the protective gas always exists surrounding the complete circumference of the substrate during the process, especially the protective gas is stronger near the locating pins because the diameter or the density of the Bernoulli holes is larger than the other regions, which can effectively avoid the treating liquid flowing from the upper surface of the substrate to the edge and the lower surface of the substrate.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A substrate supporting apparatus, comprising:
a spin chuck configured to support and rotate a substrate, the spin chuck having a supporting surface for supporting the substrate, the supporting surface defining a first annular region;
a plurality of locating pins disposed at the periphery of the supporting surface of the spin chuck and configured to limit the substrate horizontal displacement;
wherein the first annular region is divided into a plurality of pin regions and a plurality of non-pin regions, the plurality of pin regions and the plurality of non-pin regions are arranged alternatively in a circumferential direction of the first annular region, each of the pin regions is corresponding to one locating pin; and a plurality of Bernoulli holes are set in the first annular region and configured to supply gas to the substrate and suck the substrate by Bernoulli effect, the plurality of Bernoulli holes are configured as an uneven structure in the first annular region, so as to supply stronger gas flow in the pin regions than in the non-pin regions.

2. The substrate supporting apparatus of claim 1, wherein a central angle θ of each of the pin regions is 5°~10°.

3. The substrate supporting apparatus of claim 1, wherein the density or the diameter of the Bernoulli holes in the pin regions is larger than that in the non-pin regions.

4. The substrate supporting apparatus of claim 3, wherein the density or the diameter of the Bernoulli holes in each of the pin regions gradually becomes larger with the distance between the Bernoulli holes and the corresponding locating pin decreasing.

5. The substrate supporting apparatus of claim 1, wherein the diameter or the density of the Bernoulli holes formed in the first annular region gradually becomes larger with the distance between the Bernoulli holes and the locating pins decreasing.

6. The substrate supporting apparatus of claim 1, further comprising:

a convex-ring protruding upward on the periphery of the supporting surface of the spin chuck;

a recess for receiving the substrate, defined by the convex-ring and the supporting surface of the spin chuck;

a second annular region defined on the supporting surface of the spin chuck and located inside the first annular region;

a plurality of lift holes being set in the second annular region and distributed evenly in the second annular region for adjusting the height between the supporting surface of the spin chuck and the substrate.

7. The substrate supporting apparatus of claim 6, wherein the inner diameter of the convex-ring becomes larger from the lower to the upper of the recess.

8. The substrate supporting apparatus of claim 7, wherein the inner wall of the convex-ring is an arc surface.

9. The substrate supporting apparatus of claim 6, wherein the convex-ring and the spin chuck are fixed together in a detachable or integrated manner.

10. The substrate supporting apparatus of claim 6, wherein the outer edge of the top surface of the convex-ring is chamfered.

* * * * *